(12) United States Patent
Chui et al.

(10) Patent No.: US 11,152,508 B2
(45) Date of Patent: Oct. 19, 2021

(54) SEMICONDUCTOR DEVICE INCLUDING TWO-DIMENSIONAL MATERIAL LAYER

(71) Applicant: Taiwan Semiconductor Manufacturing Company, Ltd., Hsinchu (TW)

(72) Inventors: Chi On Chui, Hsinchu (TW); Sai-Hooi Yeong, Zhubei (TW); Syun-Ming Jang, Hsinchu (TW); Min Cao, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 5 days.

(21) Appl. No.: 16/549,148

(22) Filed: Aug. 23, 2019

(65) Prior Publication Data
US 2021/0057580 A1 Feb. 25, 2021

(51) Int. Cl.
*H01L 29/78* (2006.01)
*H01L 21/28* (2006.01)
*H01L 29/51* (2006.01)
*H01L 29/66* (2006.01)

(52) U.S. Cl.
CPC .. *H01L 29/78391* (2014.09); *H01L 29/40111* (2019.08); *H01L 29/513* (2013.01); *H01L 29/516* (2013.01); *H01L 29/6684* (2013.01); *H01L 29/66545* (2013.01); *H01L 29/66795* (2013.01); *H01L 29/7851* (2013.01)

(58) Field of Classification Search
CPC ........... H01L 29/78391; H01L 29/6684; H01L 29/40111; H01L 29/516; H01L 29/513; H01L 29/66795; H01L 29/7851; H01L 29/66545; H01L 29/785; H01L 29/7848; H01L 29/6653; H01L 21/28008; H01L 27/0886; H01L 27/092
See application file for complete search history.

(56) References Cited

U.S. PATENT DOCUMENTS

| 2003/0183859 | A1* | 10/2003 | Gnadinger | ............ H01L 27/105 257/295 |
| 2018/0374962 | A1* | 12/2018 | Das | ........................ H01L 29/516 |
| 2020/0098925 | A1* | 3/2020 | Dewey | ..................... H01L 29/78 |

OTHER PUBLICATIONS

Cui et al., "Two-dimensional materials with piezoelectric and ferrolelectric functionalities", (2018)2:18, pp. 1-14 (Year: 2018).*

* cited by examiner

*Primary Examiner* — Steven H Loke
*Assistant Examiner* — Juanita B Rhodes
(74) *Attorney, Agent, or Firm* — Slater Matsil, LLP

(57) ABSTRACT

A semiconductor device including a 2D material layer disposed between a gate electrode and a substrate and a method of forming the same are disclosed. In an embodiment, a device includes a ferroelectric dielectric layer disposed over and in contact with a semiconductor substrate, the ferroelectric dielectric layer including a 2D material; a gate electrode disposed over the ferroelectric dielectric layer; and source/drain regions disposed on opposite sides of the gate electrode.

20 Claims, 18 Drawing Sheets

SEMICONDUCTOR DEVICE INCLUDING TWO-DIMENSIONAL MATERIAL LAYER

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
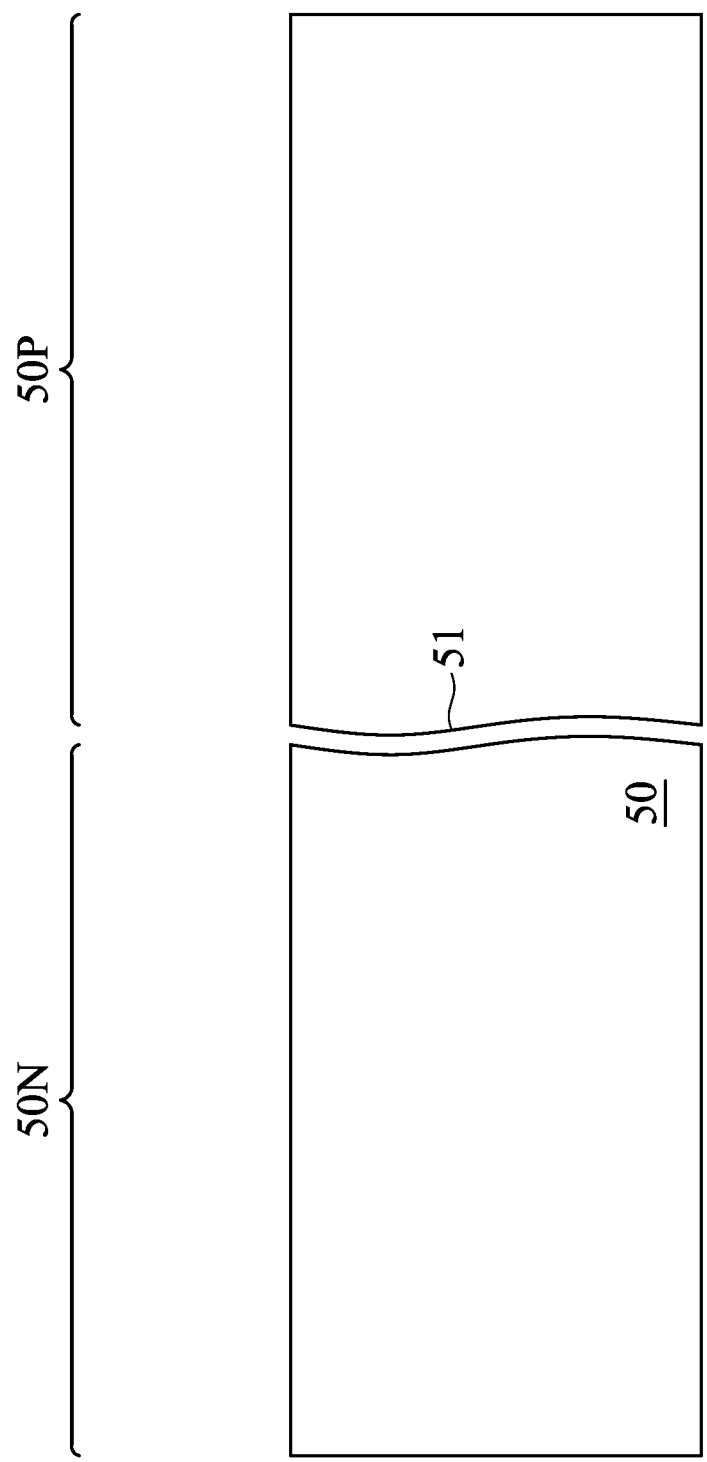
FIGS. 1, 2, 3A, 3B, 4-9, 10A, 10B, 11A, 11B, 12, and 13 are cross-sectional views of intermediate stages in the manufacturing of MOSFETs, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide improved gate dielectric layers and methods of forming the same for use in semiconductor devices. The gate dielectric layers may be formed of materials having a negative capacitance, such as ferroelectric two-dimensional (2D) materials. The gate dielectric layers may be formed over a substrate having a positive capacitance, and the thickness of the gate dielectric layers may be selected such that the negative capacitance of the gate dielectric layers matches the positive capacitance of the substrate. Semiconductor devices including the gate dielectric layers may have an increased on-off current ratio (ION/IOFF), an increased gate voltage (VG), and improved overall performance.

The embodiments discussed herein are discussed in the context of planar MOSFETs formed using a gate-last process. In other embodiments, a gate-first process may be used. Also, some embodiments contemplate aspects used in fin field effect transistors (FinFETs).

FIGS. 1 through 9B are cross-sectional views of intermediate stages in the manufacturing of planar metal-oxide semiconductor field-effect transistors (MOSFETs), in accordance with some embodiments. FIG. 1 illustrates a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type MOSFETs. The region 50P can be for forming p-type devices, such as PMOS transistors, e.g., p-type MOSFETs. The region 50N may be physically separated from the region 50P (as illustrated by divider 51), and any number of device features (e.g., other active devices, doped regions, isolation structures, or the like) may be disposed between the region 50N and the region 50P.

Figure 2:
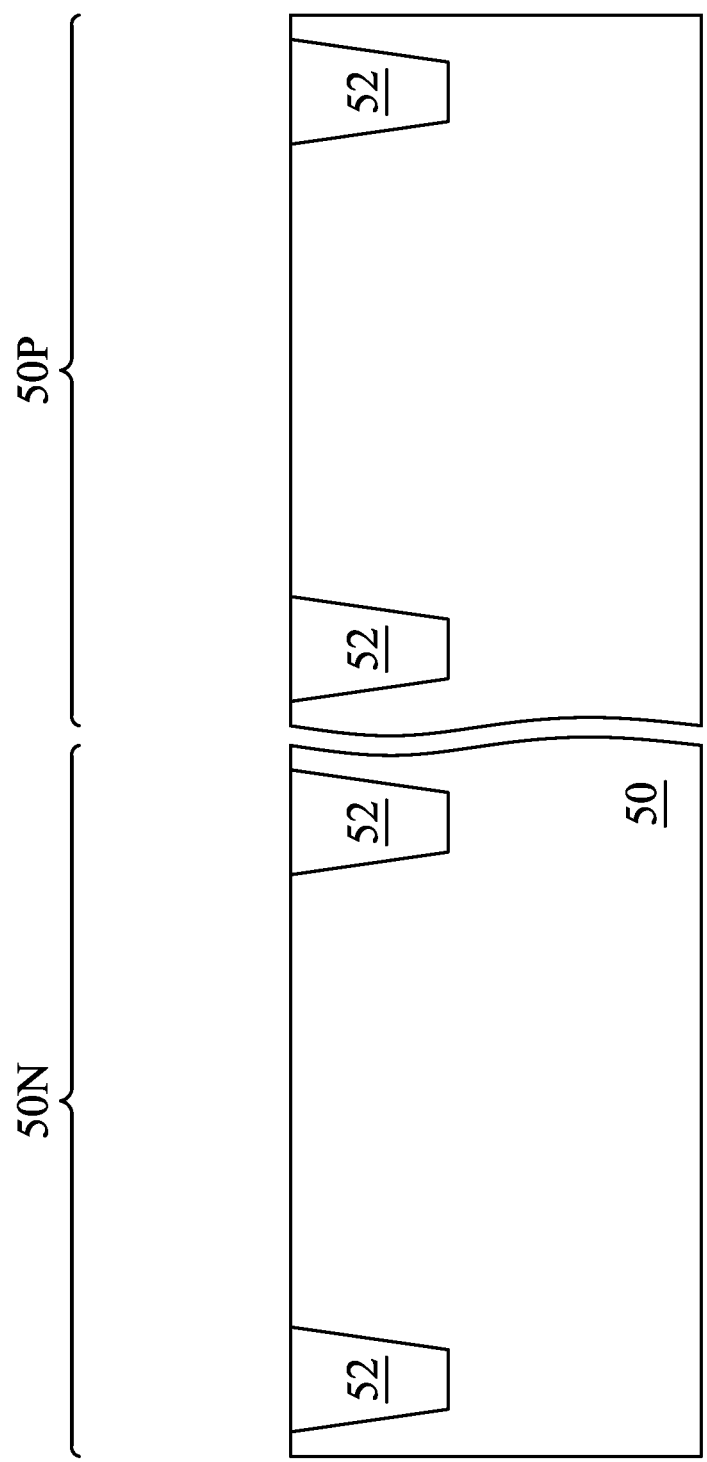

FIG. 2 illustrates the formation of isolation regions 52, such as shallow trench isolation (STI) regions, in the substrate 50. The isolation regions 52 may be formed by forming recesses (not separately illustrated) in the substrate 50. The recesses may be formed by an acceptable etch process, such as a reactive ion etch (RIE), a neutral beam etch (NBE), the like, or a combination thereof. The etch process may be anisotropic.

An insulation material is then formed over the substrate and filling the recesses. The insulation material may be an oxide, such as silicon oxide, a nitride, the like, or a combination thereof, and may be formed by a high density plasma chemical vapor deposition (HDP-CVD), a flowable chemical vapor deposition (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers top surfaces of the substrate 50. The insulation material may utilize a single layer or multiple layers. For example, in some embodiments a liner (not separately illustrated) may first be formed along a surface of the substrate 50 and filling the recesses. Thereafter, a fill material, such as those discussed above may be formed over the liner.

A removal process is applied to the insulation material to remove excess insulation material over the substrate 50. In some embodiments, a planarization process such as a chemical mechanical polish (CMP), an etch-back process, combinations thereof, or the like may be utilized. The planarization process exposes the substrate 50 such that top surfaces of the substrate 50 and the isolation regions 52 are level after the planarization process is complete.

Although not specifically illustrated, appropriate wells may be formed in the substrate 50. For example, an n-well may be formed in the substrate 50 in a region where a p-type device, such as a p-type MOSFET, is to be formed (e.g., in the region 50P). The n-well may be formed in the substrate 50 by forming a photoresist over the substrate 50. The photoresist is patterned to expose the region of the substrate 50 in which the n-well is being formed. The photoresist may be formed by using a spin-on technique and may be patterned using acceptable photolithography techniques. Once the photoresist is patterned, an n-type impurity implant is performed using the photoresist as a mask to prevent n-type impurities from being implanted into the substrate 50 outside of the desired implantation area. The n-type impurities may be phosphorus, arsenic, antimony, or the like implanted in the substrate 50 to a concentration of less than or equal to about $10^{18}$ atoms/cm$^3$, such as from about $10^{16}$ atoms/cm$^3$ to about $10^{18}$ atoms/cm$^3$. After the implant, the photoresist is removed by an acceptable process, such as ashing or the like. Further, an anneal may be performed after the implant to activate the impurities that were implanted. Thus, an n-well may be formed in the substrate 50.

A p-well may also be formed in the substrate 50 in a region where an n-type device, such as an n-type MOSFET, is to be formed (e.g., in the region 50N). The p-well may be formed using the same or similar processes to those described above for forming the n-well. The p-type impurities used to form the p-well may be boron, boron fluoride (BF$_2$), indium (In), or the like, and may be implanted to a concentration of less than or equal to about $10^{18}$ atoms/cm$^3$, such as from about $10^{16}$ atoms/cm$^3$ to about $10^{18}$ atoms/cm$^3$.

Figure 3A:
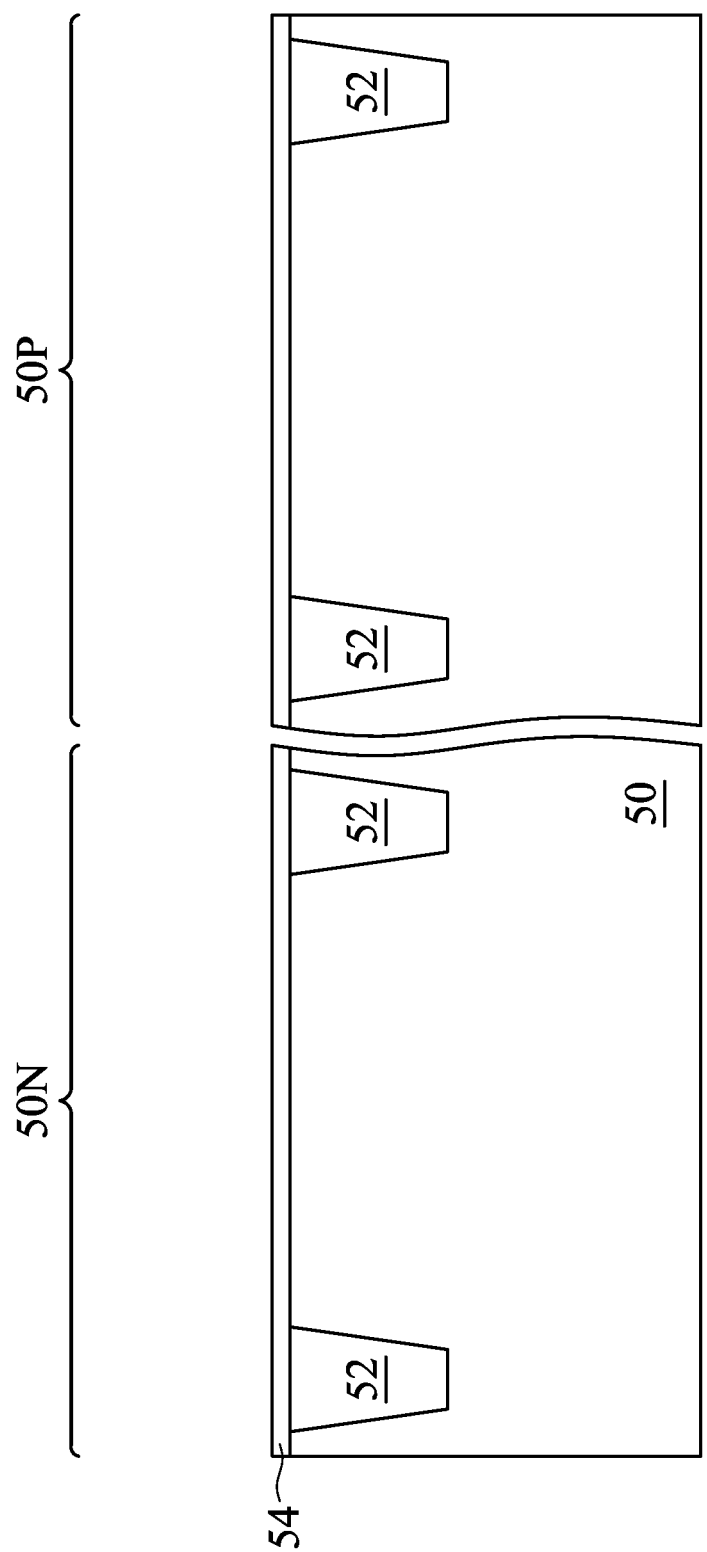

FIG. 3A illustrates a 2D material layer 54 formed over the substrate 50 and the isolation regions 52. The 2D material layer 54 may be formed of a negative capacitance material, such as a ferroelectric material. Examples of ferroelectric materials that may be used for the 2D material layer 54 include indium selenide (In$_2$Se$_3$), CuInP$_2$S$_6$ (CIPS), tin telluride (SnTe), germanium sulfide (GeS), germanium selenide (GeSe), tin sulfide (SnS), tin selenide (SnSe), combinations or multiple layers thereof, or the like. The 2D material layer 54 may be deposited by an acceptable technique, such as chemical vapor deposition (CVD), plasma-enhanced chemical vapor deposition (PECVD), metal-organic chemical vapor deposition (MOCVD), atomic layer deposition (ALD), plasma-enhanced atomic layer deposition (PEALD), or the like. As illustrated in FIG. 3A, the 2D material layer 54 may be deposited directly on the substrate 50 and the isolation regions 52, without a material, such as an interfacial layer, disposed therebetween.

The capacitance of the 2D material layer 54 depends on the number of layers of the 2D material layer 54 and thus the thickness of the 2D material layer 54. For example, the increasing the number of layers of the 2D material layer 54 deposited may increase the magnitude of the capacitance of the 2D material layer 54. The number of layers of the 2D material layer 54 that are deposited may be controlled based on growth time, precursor flowrate (including reactant partial pressures), precursor amount, growth temperature, growth pressure, selection of specific precursors, post-deposition anneal temperature, or the like. In embodiments in which the 2D material layer 54 is deposited by CVD, MOCVD, or the like, the 2D material layer 54 may be deposited at a temperature from about 700° C. to about 1100° C. In embodiments in which the 2D material layer 54 is deposited by ALD, PEALD, or the like, the 2D material layer 54 may be deposited at a temperature from about 100° C. to about 600° C. The 2D material layer 54 may be deposited at a pressure from about 10 Torr to about 100 Torr. A post-deposition anneal may be performed on the 2D material layer 54 using a temperature from about 500° C. to about 1100° C. for a period from 5 minutes to 3 hours, depending on the precursors used to deposit the 2D material layer 54. As such, the 2D material layer 54 may be deposited with a desired negative capacitance value.

The substrate 50 has a positive capacitance $C_S$, while the 2D material layer 54 has a negative capacitance $C_{FE}$. Matching the negative capacitance $C_{FE}$ of the 2D material layer 54 to the positive capacitance $C_S$ of the substrate by depositing a specific number of layers of the 2D material layer 54 results in an increased on-off current ratio ($I_{ON}/I_{OFF}$) and an increased gate voltage ($V_G$) for devices including the 2D material layer 54. Thus, devices including the 2D material layer 54 have improved performance. For advanced CMOS technology at nodes equal to or less than 28 nm, the 2D material layer 54 may have from 1 layer to 6 layers and may have a thickness from about 1 nm to about 3 nm, such as about 2 nm. For older CMOS technology at nodes above 28 nm, the 2D material layer 54 may have from 5 to 16 layers and may have a thickness from about 3 nm to about 8 nm, such as about 5.5 nm. The capacitance of the 2D material layer 54 may be matched to within ±50 percent of the capacitance of the substrate 50.

Figure 3B:
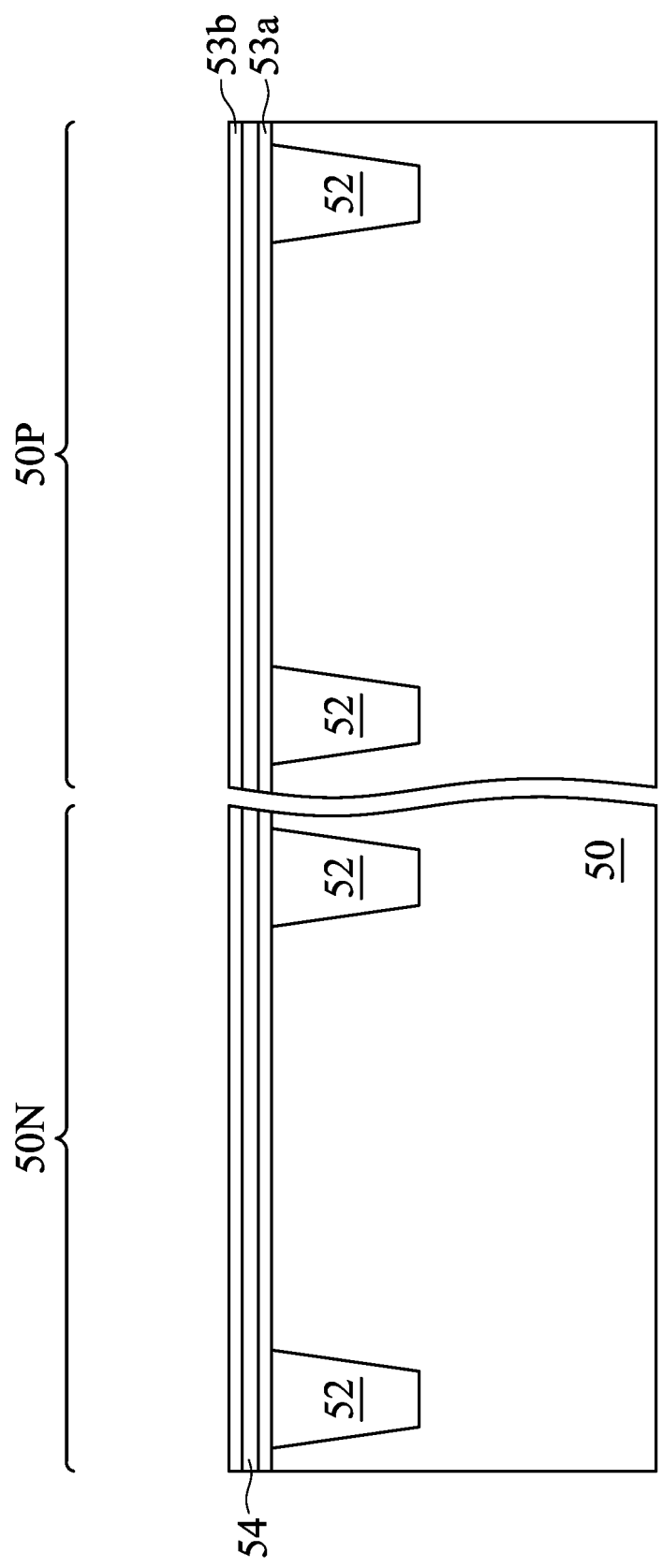

FIG. 3B illustrates another embodiment in which the 2D material layer 54 is formed over the substrate 50 and the isolation regions 52 with a first interfacial layer 53a formed between the 2D material layer and the substrate 50 and the isolation regions 52 and a second interfacial layer 53b formed over the 2D material layer 54. The first interfacial layer 53a and the second interfacial layer 53b may be formed of oxide materials, such as silicon oxide, and may be formed through thermal oxidation, chemical oxidation, ALD, or the like.

The first interfacial layer 53a and the second interfacial layer 53b may be formed of materials having a positive capacitance and may be included to further tune the capacitance of devices. As discussed in reference to FIG. 3A, the negative capacitance $C_{FE}$ of the 2D material layer 54 may be matched to the positive capacitance $C_S$ of the substrate 50. However, increasing or decreasing the number of layers of the 2D material layer 54 may increase or decrease the negative capacitance $C_{FE}$ of the 2D material layer 54 by too much to match the negative capacitance $C_{FE}$ of the 2D material layer 54 to the positive capacitance $C_S$ of the substrate 50. As such, the first interfacial layer 53a and the second interfacial layer 53b may therefore be included to provide fine-tuning of the capacitance matching.

Matching the negative capacitance $C_{FE}$ of the 2D material layer 54 to the positive capacitance $C_S$ of the substrate and the positive capacitances of the first interfacial layer 53a and the second interfacial layer 53b by selecting appropriate thicknesses of the 2D material layer 54, the first interfacial layer 53a, and the second interfacial layer 53b results in increased control of the on-off current ratio ($I_{ON}/I_{OFF}$) and the gate voltage ($V_G$) for devices including the 2D material layer 54 and any combination of the first interfacial layer 53a and the second interfacial layer 53b. Thus, devices including the 2D material layer 54 and any combination of the first interfacial layer 53a and the second interfacial layer 53b have improved performance. The 2D material layer 54 may have a thickness from about 1 nm to about 3 nm, such as about 2 nm, or from about 3 nm to about 8 nm, such as about 5.5 nm; the first interfacial layer 53a may have a thickness from about 0.5 nm to about 3 nm, such as about 1.75 nm; and the second interfacial layer 53b may have a thickness from about 2 nm to about 5 nm, such as about 3.5 nm. Any of the subsequently described embodiments may include the 2D material layer 54 only, the first interfacial layer 53a and the 2D material layer 54; the second interfacial layer 53b and the 2D material layer 54; or the first interfacial layer 53a, the second interfacial layer 53b, and the 2D material layer 54.

Figure 4:
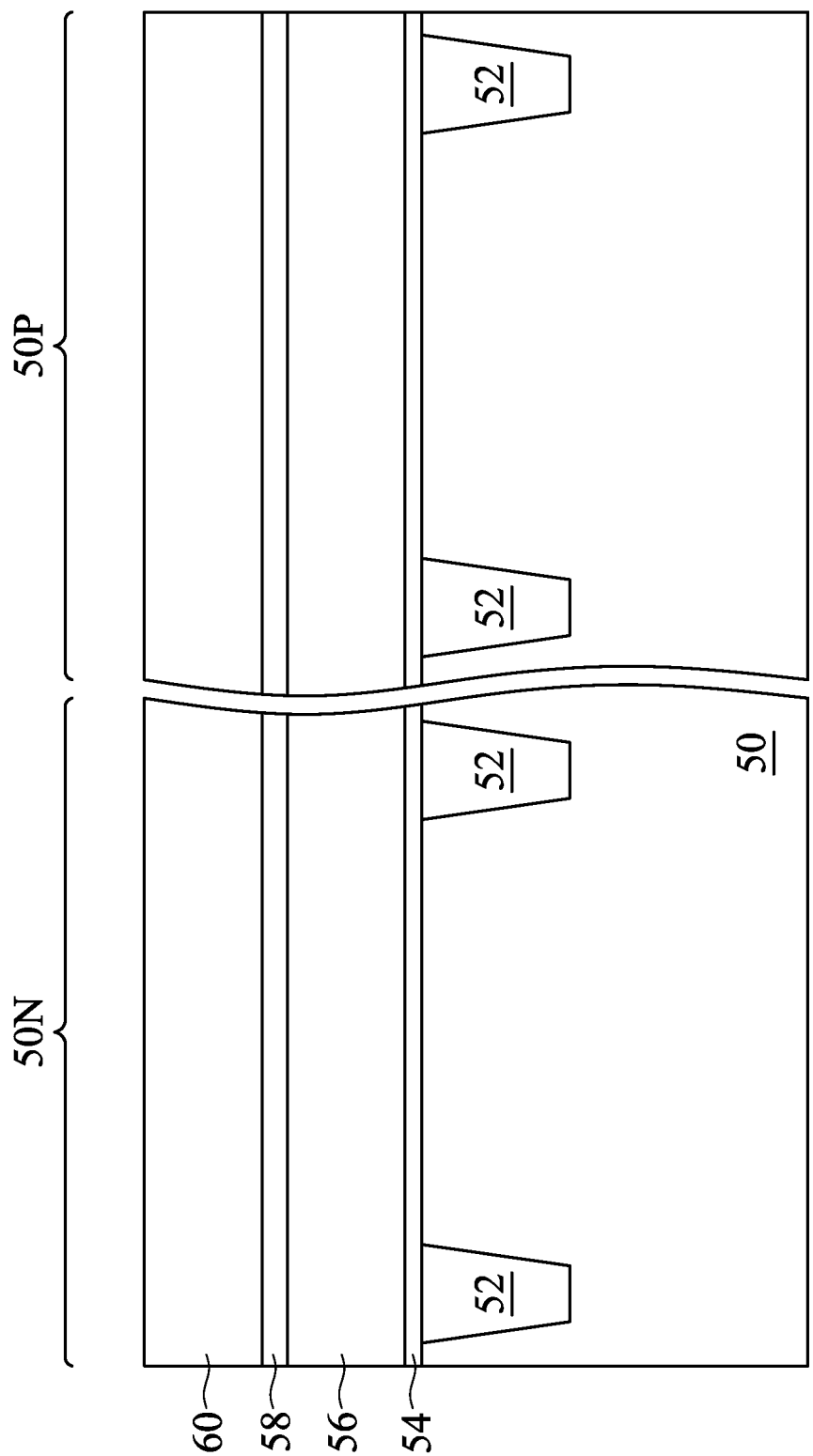

FIG. 4 illustrates a dummy gate layer 56, a first mask layer 58, and a second mask layer 60 formed over the 2D material layer 54. The dummy gate layer 56 may be deposited over the 2D material layer 54 and then planarized using a process such as a chemical mechanical polish (CMP). The dummy gate layer 56 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 56 may be deposited by physical vapor deposition (PVD), CVD, sputter deposition, or other techniques known and used in the art for depositing the selected material. The dummy gate layer 56 may be made of other materials that have a high etching selectivity from the etching of the isolation regions 52.

The first mask layer 58 is formed over the dummy gate layer 56 and the second mask layer 60 is formed over the first mask layer 58. In an embodiment, the first mask layer 58 may comprise silicon nitride and the second mask layer 60 may comprise silicon oxide (formed from a precursor such as tetraethyl orthosilicate (TEOS)); however, either of the first mask layer 58 and the second mask layer 60 may comprise silicon nitride, silicon oxide, silicon carbide, silicon oxycarbide, silicon oxynitride, the like, or a combination thereof. The first mask layer 58 and the second mask layer 60 may be deposited by a process such as CVD, atomic layer deposition (ALD), the like, or a combination thereof.

FIGS. 5 through 10B illustrate various additional steps in the manufacturing of embodiment devices. FIGS. 5 through 10B illustrate features in either of the region 50N and the region 50P. For example, the structures illustrated in FIGS. 5 through 10B may be applicable to both the region 50N and the region 50P. Differences (if any) in the structures in the region 50N and the region 50P are described in the text accompanying each figure.

Figure 5:
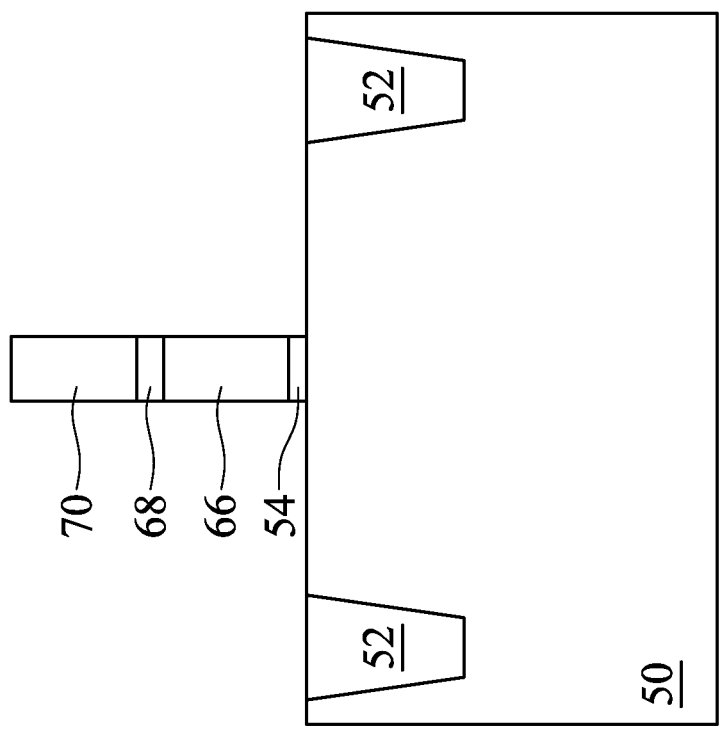

In FIG. 5, the second mask layer 60 (see FIG. 4) and the first mask layer 58 may be patterned using acceptable photolithography and etching techniques to form first masks 68 and second masks 70. The pattern of the first masks 68 and the second masks 70 then may be transferred to the dummy gate layer 56 to form dummy gates 66. In some embodiments, the pattern of the first masks 68 and the second masks 70 may also be transferred to the 2D material layer 54 by an acceptable etching technique. The dummy gates 66 cover respective channel regions of the substrate 50. The pattern of the first masks 68 and the second masks 70 may be used to physically separate each of the dummy gates 66 from adjacent dummy gates 66.

Implants for lightly doped source/drain (LDD) regions (not separately illustrated) may be performed after the dummy gates 66, the first masks 68, and the second masks 70 are formed. In embodiments in which different device types are formed in the region 50N and the region 50P, similar to the implants discussed above in FIG. 2, a mask, such as a photoresist, may be formed over the region 50N, while exposing the region 50P, and appropriate type (e.g., p-type) impurities may be implanted into exposed portions of the substrate 50 in the region 50P. The mask may then be removed. Subsequently, a mask, such as a photoresist, may be formed over the region 50P while exposing the region 50N, and appropriate type impurities (e.g., n-type) may be implanted into exposed portions of the substrate 50 in the region 50N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ atoms/cm$^3$ to about $10^{19}$ atoms/cm$^3$. An anneal may be used to repair implant damage and to activate the implanted impurities.

Figure 6:
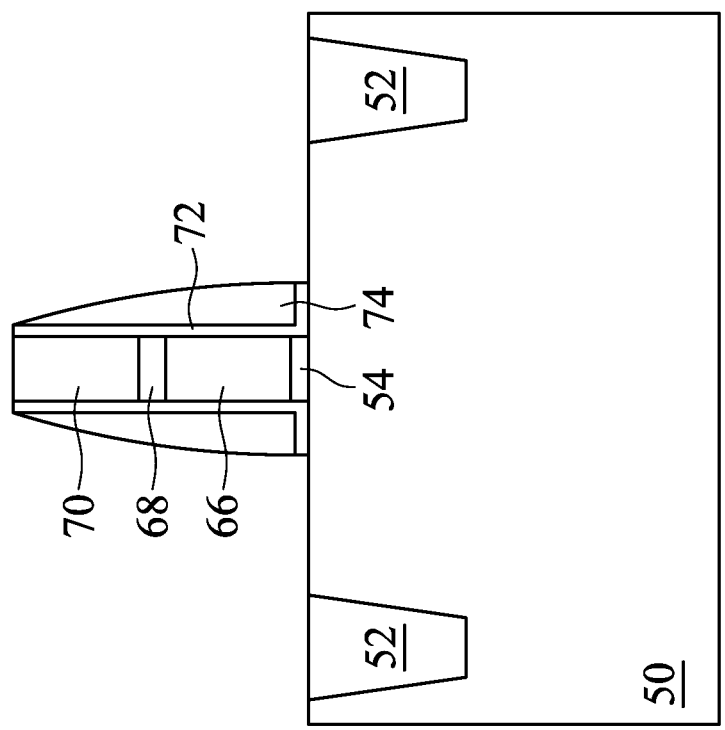

In FIG. 6, gate seal spacers 72 and gate spacers 74 are formed on exposed surfaces of the dummy gates 66, the first masks 68, the second masks 70, and/or the substrate 50. A thermal oxidation or a deposition (e.g., a CVD, an ALD, or the like) may form the gate seal spacers 72. The gate seal spacers 72 may be formed of silicon oxide, silicon nitride, silicon oxynitride, or the like. Gate spacers 74 are then formed on the gate seal spacers 72 along sidewalls of the dummy gates 66, the first masks 68, and the second masks 70. The gate spacers 74 may be formed by conformally depositing an insulating material over the gate seal spacers 72. The gate seal spacers 72 and the gate spacers 74 may then be anisotropically etched to form the structures illustrated in FIG. 6. The insulating material of the gate spacers 74 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 72 may be etched prior to forming the gate spacers 74, yielding "I-shaped" gate seal spacers), spacers may be formed and removed, and/or the like. Furthermore, the n-type and p-type devices may be formed using different structures and steps. For example, LDD regions for n-type devices may be formed prior to forming the gate seal spacers 72, while the LDD regions for p-type devices may be formed after forming the gate seal spacers 72.

Figure 7:
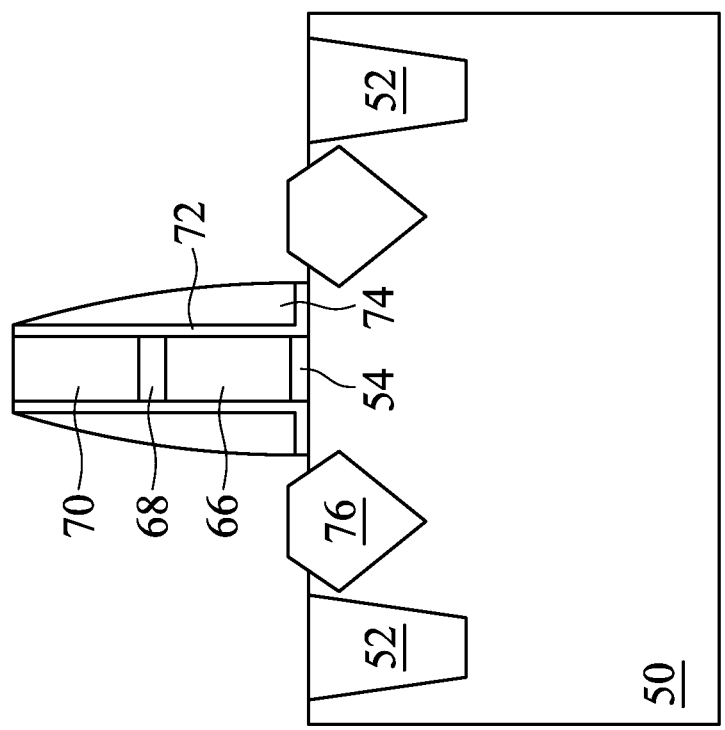

In FIG. 7 epitaxial source/drain regions 76 are formed in the substrate 50 to exert stress in the respective channel regions, thereby improving performance. The epitaxial source/drain regions 76 are formed in the substrate 50 such that each dummy gate 66 is disposed between respective neighboring pairs of the epitaxial source/drain regions 76. In some embodiments, the gate spacers 74 and the gate seal spacers 72 are used to separate the epitaxial source/drain regions 76 from the dummy gates 66 by an appropriate lateral distance so that the epitaxial source/drain regions 76 do not short out subsequently formed gates of the resulting MOSFETs.

The epitaxial source/drain regions 76 in the region 50N, e.g., the NMOS region, may be formed by masking the region 50P, e.g., the PMOS region, and etching source/drain regions of the substrate 50 in the region 50N to form recesses in the substrate 50. Then, the epitaxial source/drain regions 76 in the region 50N are epitaxially grown in the recesses. The epitaxial source/drain regions 76 may include any acceptable material, such as appropriate for n-type MOSFETs. For example, if the substrate 50 is silicon, the epitaxial source/drain regions 76 in the region 50N may include materials exerting a tensile strain in the channel region, such as silicon, silicon carbide, phosphorous doped silicon carbide, silicon phosphide, or the like. The epitaxial source/drain regions 76 in the region 50N may have surfaces raised from respective surfaces of the substrate 50 and may have facets.

The epitaxial source/drain regions 76 in the region 50P, e.g., the PMOS region, may be formed by masking the region 50N, e.g., the NMOS region, and etching source/drain regions of the substrate 50 in the region 50P to form recesses in the substrate 50. Then, the epitaxial source/drain regions 76 in the region 50P are epitaxially grown in the recesses. The epitaxial source/drain regions 76 may include any acceptable material, such as appropriate for p-type MOSFETs. For example, if the substrate 50 is silicon, the epitaxial source/drain regions 76 in the region 50P may comprise materials exerting a compressive strain in the channel region, such as silicon-germanium, boron doped silicon-germanium, germanium, germanium tin, or the like. The epitaxial source/drain regions 76 in the region 50P may also have surfaces raised from respective surfaces of the substrate 50 and may have facets.

The epitaxial source/drain regions 76 and/or the substrate 50 may be implanted with dopants to form source/drain regions, similar to the process previously discussed for forming LDD regions, followed by an anneal. The epitaxial source/drain regions 76 may have an impurity concentration of between about $10^{19}$ atoms/cm$^3$ and about $10^{21}$ atoms/cm$^3$. The n-type and/or p-type impurities for source/drain regions may be any of the impurities previously discussed. In some embodiments, the epitaxial source/drain regions 76 may be in situ doped during growth.

Figure 8:
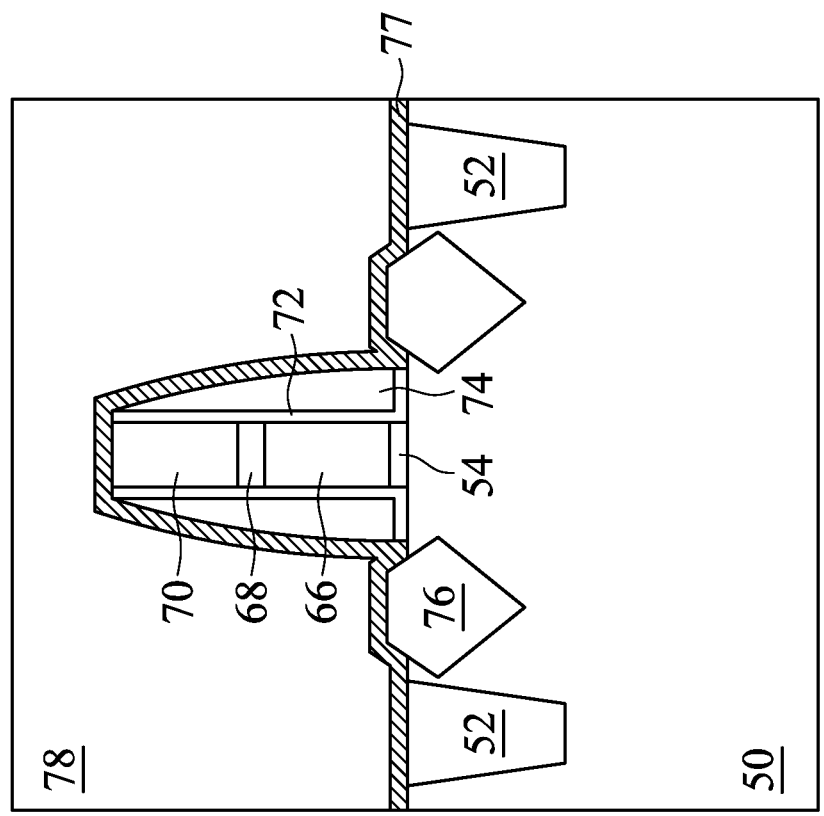

In FIG. 8, a first interlayer dielectric (ILD) 78 is deposited over the structure illustrated in FIG. 7. The first ILD 78 may be formed of a dielectric material, and may be deposited by any suitable method, such as CVD, PECVD, FCVD, or the like. Dielectric materials may include phosphosilicate glass (PSG), borosilicate glass (BSG), boron-doped phosphosilicate glass (BPSG), undoped silicate glass (USG), or the like. Other insulation materials formed by any acceptable process may be used. In some embodiments, a contact etch stop layer (CESL) 77 is disposed between the first ILD 78 and the epitaxial source/drain regions 76, the second masks 70, the gate seal spacers 72, and the gate spacers 74. The CESL 77 may comprise a dielectric material, such as, silicon nitride, silicon oxide, silicon oxynitride, or the like, having a different etch rate than the material of the overlying first ILD 78.

Figure 9:
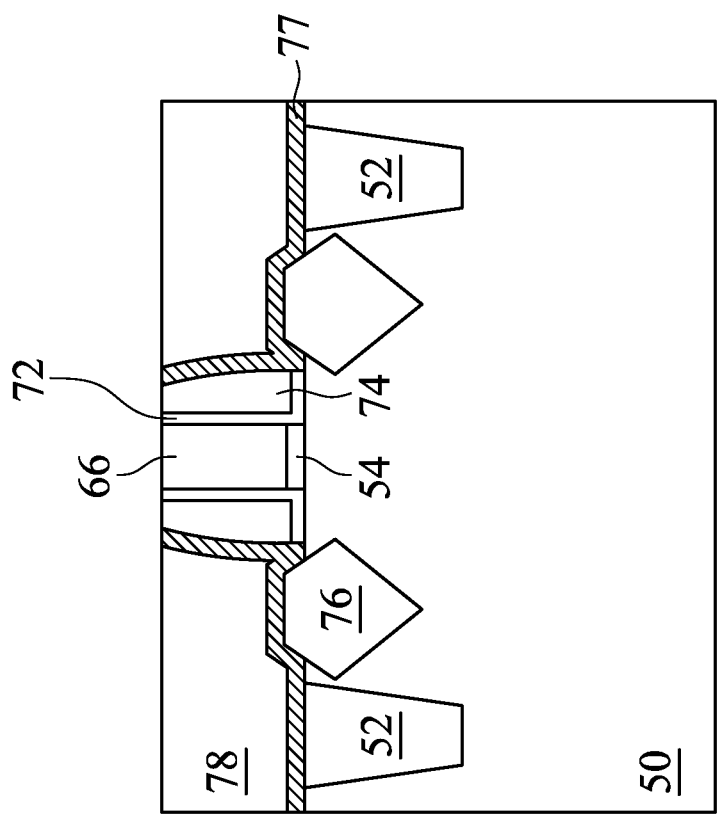

In FIG. 9, a planarization process, such as a CMP, may be performed to level the top surface of the first ILD 78 with top surfaces of the dummy gates 66, the first masks 68, or the second masks 70. The planarization process may remove the second masks 70 or the second masks 70 and the first masks 68 on the dummy gates 66, and portions of the gate seal spacers 72 and the gate spacers 74 along sidewalls of the first masks 68 and the second masks 70. After the planarization process, top surfaces of the dummy gates 66, the gate seal spacers 72, the gate spacers 74, and the first ILD 78 are level. Accordingly, the top surfaces of the dummy gates 66 are exposed through the first ILD 78. In some embodiments, the first masks 68 or the first masks 68 and the second masks 70 may remain, in which case the planarization process levels the top surface of the first ILD 78 with the top surfaces of the first masks 68 or the second masks 70.

Figure 10A:
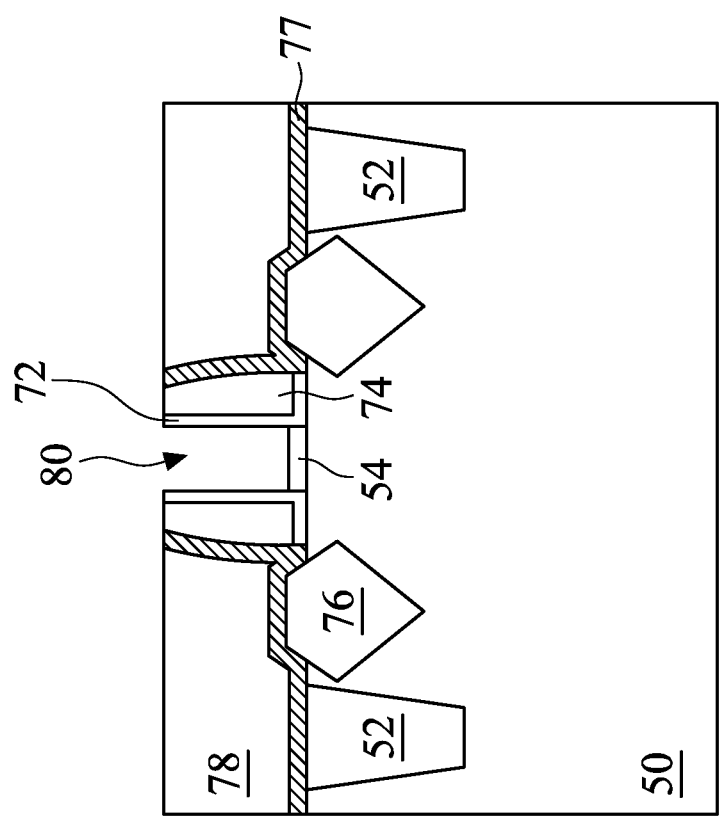
Figure 10B:
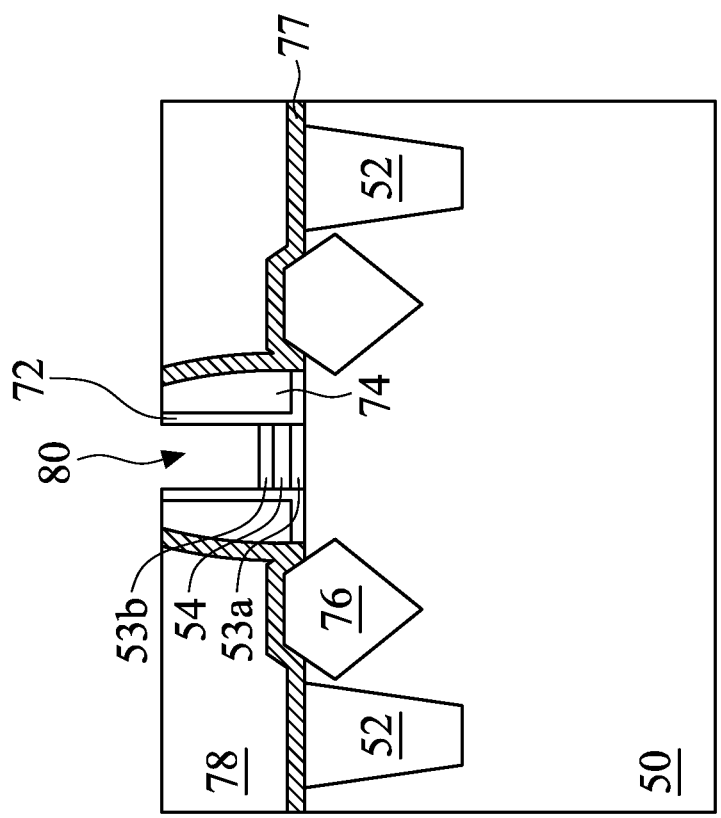

In FIGS. 10A and 10B, an etching process is performed to remove the dummy gates 66, forming recesses 80. As illustrated in FIG. 10A, the 2D material layer 54 remains after the dummy gates 66 are removed and the 2D material layer 54 is exposed by the recesses 80. Similarly, as illustrated in FIG. 10B, in embodiments including the first interfacial layer 53a and the second interfacial layer 53b, the second interfacial layer 53b remains after the dummy gates 66 are removed and the second interfacial layer 53 is exposed by the recesses 80. In some embodiments, the dummy gates 66 are removed by an anisotropic dry etch process. For example, the etching process may include a dry etch process using reaction gases that selectively etch the dummy gates 66 without etching the first ILD 78, the 2D material layer 54, the second interfacial layer 53b, the gate seal spacers 72, or the gate spacers 74. Each of the recesses 80 overlies a respective channel region of the substrate 50. Each of the channel regions is disposed between neighboring pairs of the epitaxial source/drain regions 76. During the removal, the 2D material layer 54 or the second interfacial layer 53b may be used as an etch stop layer when the dummy gates 66 are etched.

Figure 11A:
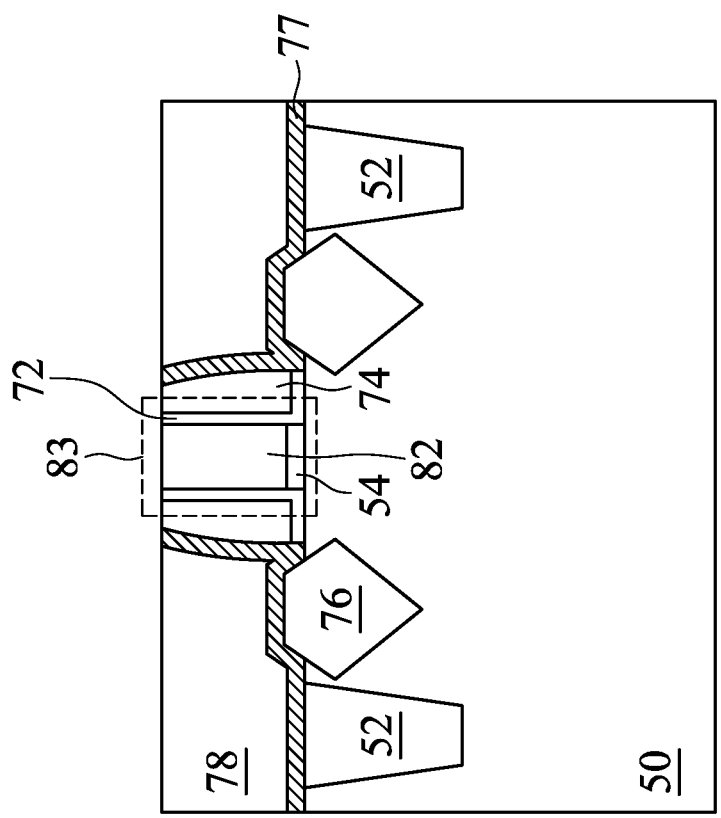
Figure 11B:
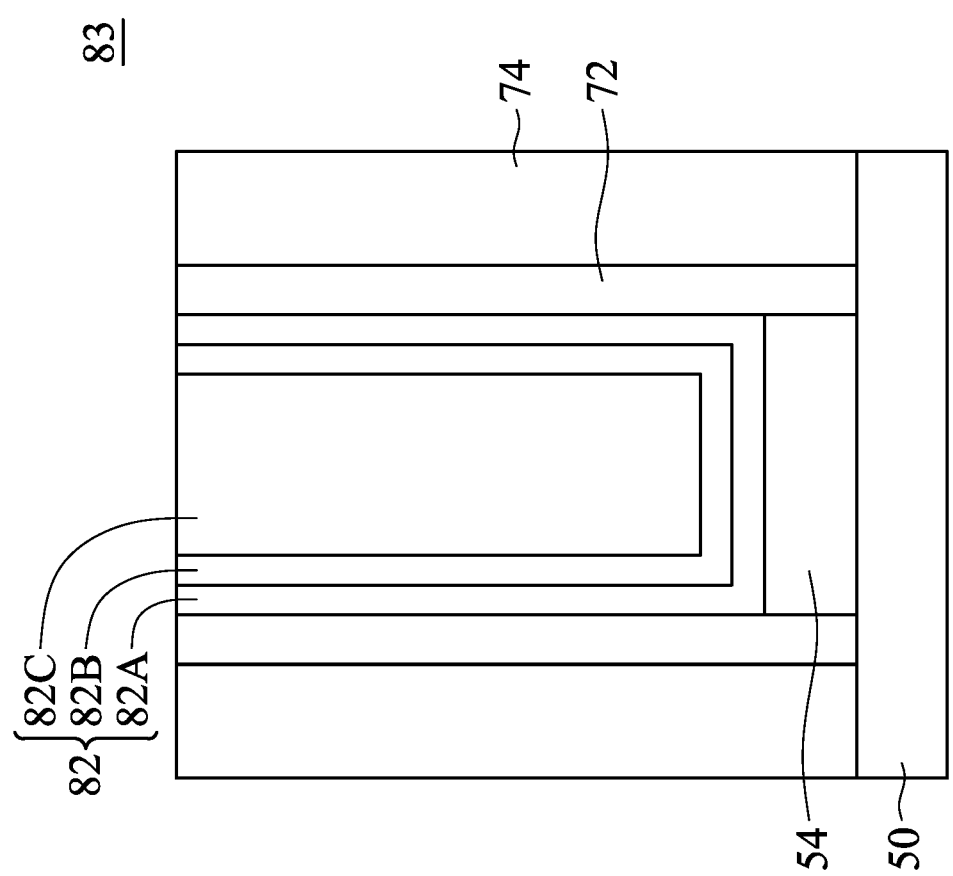

In FIG. 11A, gate electrodes 82 are formed for replacement gates. FIG. 11B illustrates a detailed view of region 83 of FIG. 11A. The gate electrodes 82 are deposited over the 2D material layer 54 and fill the recesses 80. The gate electrodes 82 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 82 is illustrated in FIG. 11A, the gate electrodes 82 may comprise any number of liner layers 82A, any number of work function tuning layers 82B, and a fill material 82C as illustrated by FIG. 11B. After the filling of the recesses 80, a planarization process, such as a CMP, may be performed to remove the excess portions of the material of the gate electrodes 82, which excess portions are over the top surface of the first ILD 78. The remaining portions of material of the gate electrodes 82 and the 2D material layer 54 thus form replacement gates of the resulting MOSFETs. The gate electrodes 82 and the 2D material layer 54 may be collectively referred to as a "gate stack." The gate and the gate stacks may extend over channel regions of the substrate 50.

The formation of the gate electrodes 82 in the region 50N and the region 50P may occur simultaneously such that the gate electrodes 82 in each region are formed from the same materials. In some embodiments, the gate electrodes 82 in each region may be formed by distinct processes, such that the gate electrodes 82 may be different materials. Various masking steps may be used to mask and expose appropriate regions when using distinct processes.

Figure 12:
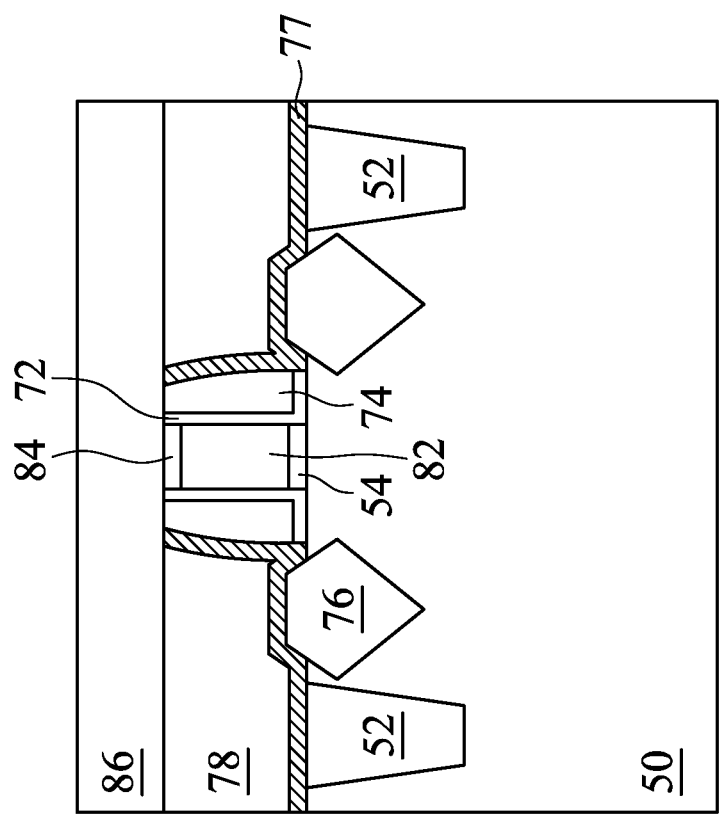

In FIG. 12, a second ILD 86 is deposited over the first ILD 78. In some embodiments, the second ILD 86 is a flowable film formed by an FCVD method. In some embodiments, the second ILD 86 is formed of a dielectric material such as PSG, BSG, BPSG, USG, or the like, and may be deposited by any suitable method, such as CVD, PECVD, or the like. In accordance with some embodiments, the gate stack (e.g., the gate electrode 82) is recessed before forming the second ILD 86, so that a recess (not separately illustrated) is formed directly over the gate stack and between opposing portions of the gate seal spacers 72, as illustrated in FIG. 12. A gate mask 84 comprising one or more layers of dielectric material, such as silicon nitride, silicon oxynitride, or the like, is filled in the recess, followed by a planarization process to remove excess portions of the dielectric material extending over the first ILD 78. Subsequently formed gate contacts (e.g., gate contacts 88 illustrated in FIG. 13) may penetrate through the gate mask 84 to contact the top surface of the recessed gate electrode 82.

Figure 13:
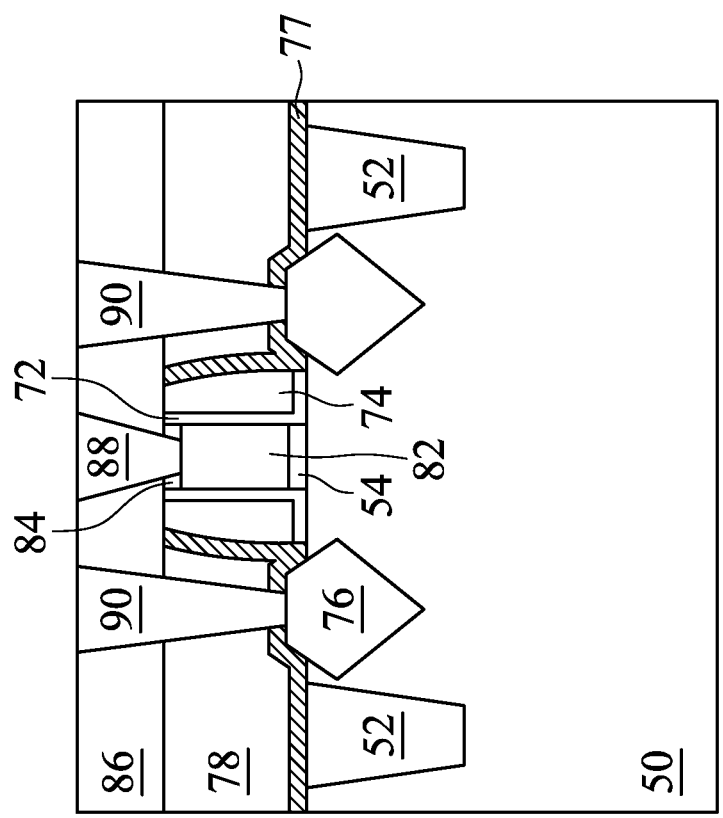

In FIG. 13, gate contacts 88 are formed through the second ILD 86 and the gate mask 84 and source/drain contacts 90 are formed through the second ILD 86 and the first ILD 78, in accordance with some embodiments. Openings (not separately illustrated) for the gate contacts 88 are formed through the second ILD 86 and the gate mask 84 and openings for the source/drain contacts 90 are formed through the second ILD 86 and the first ILD 78. The openings may be formed using acceptable photolithography and etching techniques. A liner (not separately illustrated), such as a diffusion barrier layer, an adhesion layer, or the like, and a conductive material (not separately illustrated) are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 86. The remaining liner and conductive material form the gate contacts 88 and the source/drain contacts 90 in the openings. An anneal process may be performed to form a silicide at the interface between the epitaxial source/drain regions 76 and the source/drain contacts 90. The source/drain contacts 90 are physically and electrically coupled to the epitaxial source/drain regions 76, and the gate contacts 88 are physically and electrically coupled to the gate electrodes 82. The gate contacts 88 and the source/drain contacts 90 may be formed by different processes, or may be formed by the same process. Although the gate contacts 88 are shown as being formed in the same cross-sections as the source/drain contacts 90, it should be appreciated that each of the gate contacts 88 and the source/drain contacts 90 may be formed in different cross-sections, which may avoid shorting of the contacts.

Forming semiconductor devices including the 2D material layer 54 alone or combinations of the 2D material layer 54, the first interfacial layer 53a, and the second interfacial layer 53b allows the positive capacitances of the substrate 50, the first interfacial layer 53a, and the second interfacial layer 53b to be matched by the negative capacitance of the 2D material layer 54. This results in an increased on-off current ratio ($I_{ON}/I_{OFF}$) and an increased gate voltage ($V_G$) for the semiconductor devices and improved device performance.

Figure 14B:
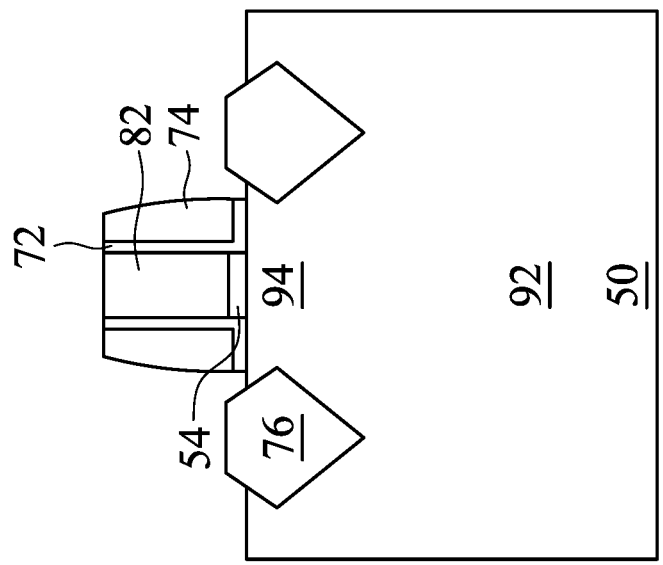
FIGS. 14A, 14B, 15A, and 15B are cross-sectional views of FinFETs, in accordance with some embodiments.
Figure 14A:
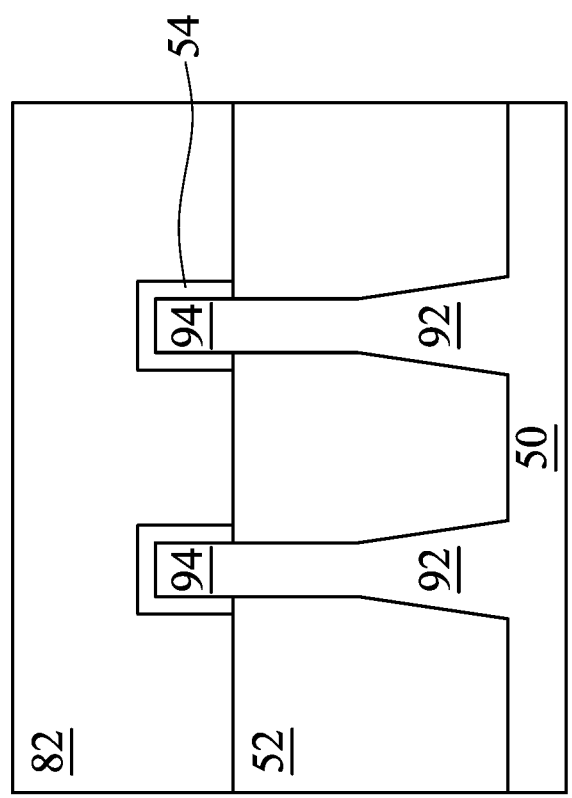
Figure 15B:
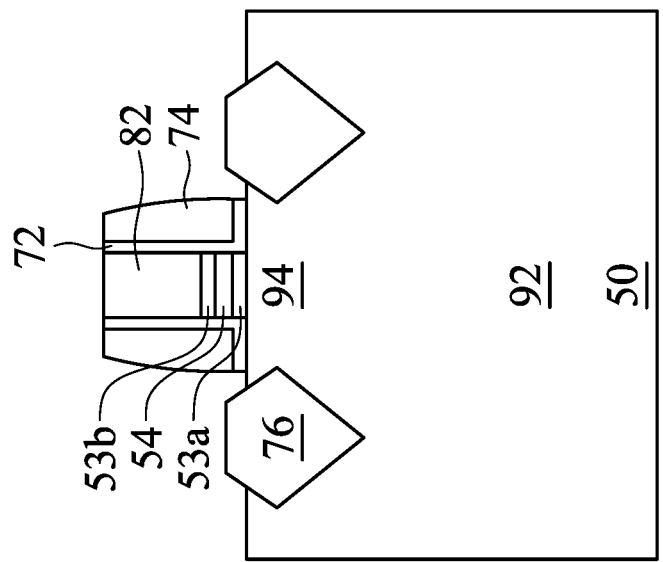
Figure 15A:
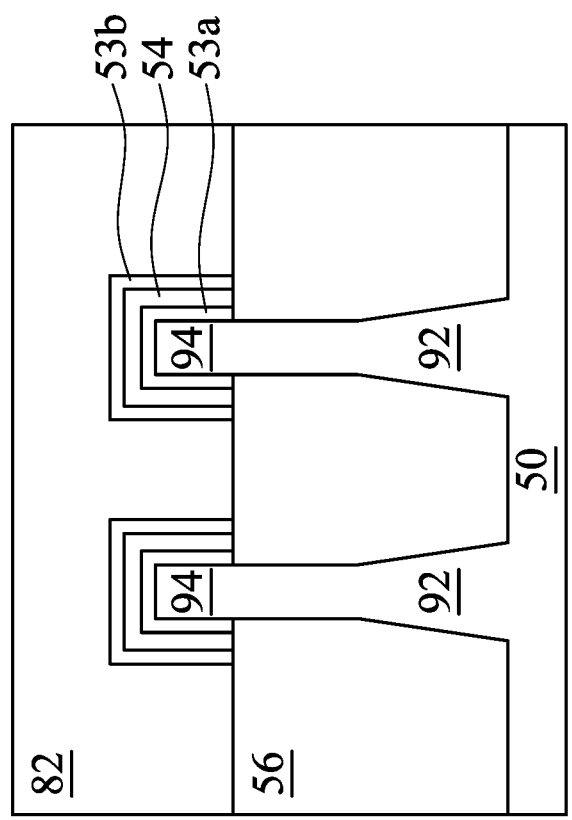

FIGS. 14A and 14B illustrate a fin field-effect transistor (FinFET) including the 2D material layer 54 and FIGS. 15A and 15B illustrate a FinFET including the 2D material layer 54, the first interfacial layer 53a, and the second interfacial layer 53b. The FinFETs include fins 92 extending from a substrate 50 (e.g., a semiconductor substrate). Isolation regions 52 are disposed in the substrate 50, and the fins 92 protrude above and from between neighboring isolation regions 52. Although the isolation regions 52 are described/illustrated as being separate from the substrate 50, as used herein the term "substrate" may be used to refer to just the semiconductor substrate or a semiconductor substrate inclusive of isolation regions. Additionally, although the fins 92 are illustrated as being single, continuous materials with the substrate 50, the fins 92 and/or the substrate 50 may comprise a single material or a plurality of materials. In this context, the fins 92 refer to the portions extending between the neighboring isolation regions 52.

The 2D material layer 54 or the 2D material layer 54, the first interfacial layer 53a, and the second interfacial layer 53b are disposed along sidewalls and over top surfaces of the fins 92, and gate electrodes 82 are disposed over the 2D material layer 54 or the second interfacial layer 53b. The 2D material layer 54 or the first interfacial layer 53a cover respective channel regions 94 of the fins 92. Source/drain regions 76 are disposed in opposite sides of the fins 92 with respect to the gate electrodes 82. The cross-sections illustrated in FIGS. 14A and 15A are along longitudinal axes of the gate electrodes 82 and in a direction, for example, perpendicular to the direction of current flow between the source/drain regions 76 of the FinFETs. The cross-sections illustrated in FIGS. 14B and 15B are perpendicular to the cross-sections illustrated in FIGS. 14A and 15A and are along longitudinal axes of the fins 92 and in a direction of, for example, a current flow between the source/drain regions 76 of the FinFETs.

Including the 2D material layer 54 alone or combinations of the 2D material layer 54, the first interfacial layer 53a, and the second interfacial layer 53b in FinFETs allows the positive capacitances of the substrate 50, the first interfacial layer 53a, and the second interfacial layer 53b to be matched by the negative capacitance of the 2D material layer 54. This results in an increased on-off current ratio ($I_{ON}/I_{OFF}$) and an increased gate voltage ($V_G$) for the semiconductor devices and improved device performance.

In accordance with an embodiment, a device includes a ferroelectric dielectric layer disposed over and in contact with a semiconductor substrate, the ferroelectric dielectric layer including a 2D material; a gate electrode disposed over the ferroelectric dielectric layer; and source/drain regions disposed on opposite sides of the gate electrode. In an embodiment, the ferroelectric dielectric layer includes indium selenide ($In_2Se_3$), $CuInP_2S_6$ (CIPS), tin telluride (SnTe), germanium sulfide (GeS), germanium selenide (GeSe), tin sulfide (SnS), or tin selenide (SnSe). In an embodiment, the gate electrode physically contacts the ferroelectric dielectric layer. In an embodiment, the device further includes an interfacial layer disposed between the ferroelectric dielectric layer and the gate electrode, the interfacial layer including an oxide. In an embodiment, the interfacial layer has a thickness from 2 nm to 5 nm. In an embodiment, the ferroelectric dielectric layer has a thickness from 1 nm to 3 nm. In an embodiment, the ferroelectric dielectric layer has a thickness from 3 nm to 8 nm. In an embodiment, the device further includes a fin extending from the semiconductor substrate, the ferroelectric dielectric layer and the gate electrode being disposed on the fin.

In accordance with another embodiment, a method includes forming a 2D material layer over a substrate, the 2D material layer including a ferroelectric material; forming a dummy gate electrode over the 2D material layer; etching the dummy gate electrode to form a first opening exposing the 2D material layer; and forming a metal gate electrode in the first opening. In an embodiment, the 2D material layer is formed using chemical vapor deposition (CVD) or plasma-enhanced chemical vapor deposition (PECVD). In an embodiment, the method further includes forming a first interfacial layer over the substrate before the forming the 2D material layer. In an embodiment, the method further includes forming a second interfacial layer over the 2D material layer before the forming the dummy gate electrode. In an embodiment, the first interfacial layer has a thickness from 0.5 nm to 3 nm and the second interfacial layer has a thickness from 2 nm to 5 nm. In an embodiment, the first interfacial layer and the second interfacial layer are formed using thermal oxidation or atomic layer deposition.

In accordance with yet another embodiment, a device includes a gate stack including a first interfacial layer over a substrate; a 2D material layer over the first interfacial layer; a second interfacial layer over the 2D material layer; and a gate electrode over the second interfacial layer; and a source/drain region adjacent the gate stack. In an embodiment, the 2D material layer includes a ferroelectric material. In an embodiment, the 2D material layer includes indium selenide ($In_2Se_3$), $CuInP_2S_6$ (CIPS), tin telluride (SnTe), germanium sulfide (GeS), germanium selenide (GeSe), tin sulfide (SnS), or tin selenide (SnSe). In an embodiment, the 2D material layer has a thickness from 1 nm to 3 nm. In an embodiment, the first interfacial layer and the second interfacial layer include oxides. In an embodiment, the first interfacial layer has a thickness from 0.5 nm to 3 nm and the second interfacial layer has a thickness from 2 to 5 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a ferroelectric dielectric layer disposed over and in contact with a semiconductor substrate, the ferroelectric dielectric layer comprising a two-dimensional (2D) material;
a gate electrode disposed over the ferroelectric dielectric layer;
a first gate spacer and a second gate spacer disposed on opposite sides of the gate electrode, wherein the ferroelectric dielectric layer physically contacts the first gate spacer and the second gate spacer, and wherein a bottom surface of the ferroelectric dielectric layer is level with a bottom surface of the first gate spacer and a bottom surface of the second gate spacer; and
source/drain regions disposed on opposite sides of the gate electrode.

2. The device of claim 1, wherein the ferroelectric dielectric layer comprises indium selenide ($In_2Se_3$).

3. The device of claim 1, wherein the gate electrode physically contacts the ferroelectric dielectric layer.

4. The device of claim 1, further comprising an interfacial layer disposed between the ferroelectric dielectric layer and the gate electrode, the interfacial layer comprising an oxide.

5. The device of claim 4, wherein the interfacial layer has a thickness from 2 nm to 5 nm.

6. The device of claim 1, wherein the ferroelectric dielectric layer has a thickness from 1 nm to 3 nm.

7. The device of claim 1, wherein the ferroelectric dielectric layer has a thickness from 3 nm to 8 nm.

8. The device of claim 1, further comprising a fin extending from the semiconductor substrate, the ferroelectric dielectric layer and the gate electrode being disposed on the fin.

9. A device comprising:
a gate stack comprising:
a first interfacial layer over a substrate;
a two-dimensional (2D) material layer over the first interfacial layer;
a second interfacial layer over the 2D material layer; and
a gate electrode over the second interfacial layer;
a source/drain region adjacent the gate stack; and
a gate spacer between the gate stack and the source/drain region, wherein the 2D material layer physically contacts the gate spacer, and wherein a bottom surface of the gate stack is level with a bottom surface of the gate spacer.

10. The device of claim 9, wherein the 2D material layer comprises a ferroelectric material.

11. The device of claim 10, wherein the 2D material layer comprises germanium sulfide (GeS).

12. The device of claim 11, wherein the 2D material layer has a thickness from 1 nm to 3 nm.

13. The device of claim 9, wherein the first interfacial layer and the second interfacial layer comprise oxides.

14. The device of claim 13, wherein the first interfacial layer has a thickness from 0.5 nm to 3 nm and the second interfacial layer has a thickness from 2 to 5 nm.

15. A device comprising:
a two-dimensional (2D) material layer over a substrate, the 2D material layer comprising a ferroelectric material;
a metal gate electrode over the 2D material layer; and
a first gate spacer and a second gate spacer on opposite sides of the 2D material layer and the metal gate electrode, wherein the 2D material layer extends from the first gate spacer to the second gate spacer, wherein a gate stack comprises the 2D material layer and the metal gate electrode, wherein a bottom surface of the gate stack is level with bottom surfaces of the first gate spacer and the second gate spacer, and wherein the 2D material layer physically contacts the first gate spacer and the second gate spacer.

16. The device of claim 15, wherein the 2D material layer is in physical contact with the substrate and the metal gate electrode.

17. The device of claim 15, further comprising a first interfacial layer between the 2D material layer and the substrate.

18. The device of claim 17, further comprising a second interfacial layer over the 2D material layer between the metal gate electrode and the 2D material layer.

19. The device of claim 18, wherein the first interfacial layer has a thickness from 0.5 nm to 3 nm and the second interfacial layer has a thickness from 2 nm to 5 nm.

20. The device of claim 18, wherein the first interfacial layer and the second interfacial layer extend from the first gate spacer to the second gate spacer.

\* \* \* \* \*